United States Patent
Arana et al.

(10) Patent No.: US 7,087,451 B2
(45) Date of Patent: Aug. 8, 2006

(54) MICROFABRICATED HOT WIRE VACUUM SENSOR

(75) Inventors: Leonel R. Arana, Phoenix, AZ (US); Yuelin Lee Zou, Phoenix, AZ (US); John Heck, Berkeley, CA (US)

(73) Assignee: Intel Corporation, Santa Clara, CA (US)

(*) Notice: Subject to any disclaimer, the term of this patent is extended or adjusted under 35 U.S.C. 154(b) by 176 days.

(21) Appl. No.: 10/807,836

(22) Filed: Mar. 24, 2004

(65) Prior Publication Data

US 2005/0212066 A1    Sep. 29, 2005

(51) Int. Cl.
*H01L 21/00*    (2006.01)
*H01L 31/058*    (2006.01)

(52) U.S. Cl. .......................... 438/54; 438/55; 257/467

(58) Field of Classification Search .................. 438/15, 438/54, 55; 257/108, 467, 684
See application file for complete search history.

(56) References Cited

U.S. PATENT DOCUMENTS

| 6,074,891 | A | * | 6/2000 | Staller ......................... 438/53 |
| 6,140,144 | A | * | 10/2000 | Najafi et al. .................. 438/53 |
| 6,553,841 | B1 | | 4/2003 | Blouch | |

FOREIGN PATENT DOCUMENTS

| DE | 43 24 119 | 1/1994 |
| DE | 199 03 010 | 8/2000 |
| DE | 100 49 556 | 6/2001 |
| JP | 63-284835 | 11/1988 |
| JP | 2001-324403 | * 11/2001 |

OTHER PUBLICATIONS

Leonel Arana, "High-Temperature Microfluidic Systems for Thermally-Efficient Fuel Processing", Ph.D. Thesis, Department of Chemical Engineering, MIT, Cambridge, MA, Jun. 2003.

* cited by examiner

*Primary Examiner*—Carl Whitehead, Jr.
*Assistant Examiner*—H. Doty
(74) *Attorney, Agent, or Firm*—Trop, Pruner & Hu, P.C.

(57) ABSTRACT

A microfabricated vacuum sensor may be formed using semiconductor integrated circuit processes. The sensor may be formed inside an enclosure with a microfabricated component. The sensor may then be used to measure the pressure within the enclosure.

20 Claims, 3 Drawing Sheets

MICROFABRICATED HOT WIRE VACUUM SENSOR

BACKGROUND

This invention relates generally to vacuum sensors to sense pressure within an enclosed system.

Integrated circuits may be hermetically packaged. There are a number of reasons for hermetically packaging components but, generally, hermetic packaging is used to isolate those components from the deleterious effects of the surrounding environment. Vacuum packaging of integrated circuits in microsystems may enhance device performance and/or to improve reliability.

However, monitoring the pressure within a vacuum package is difficult because stand-alone vacuum sensors typically are too large and costly to integrate within an integrated circuit package. Absent an internal sensor, the internal pressure within the vacuum package cavity is unknown over the life of the product and can only be estimated from gas pressure measured during the packaging process.

Hermetic packaging may also enable control of ambient gas composition and/or pressure. There are techniques to characterize the leak tightness of packages such as fluorocarbon bubble and helium detection tests. However, there are no universal techniques to measure the leak tightness of packages with very small cavities, such as those of a size less than a cubic centimeter, that may be found in numerous commercial microelectromechanical system devices, including those with radio frequency components.

Thus, there is a need for better ways to measure cavity pressure.

DETAILED DESCRIPTION

Figure 1:
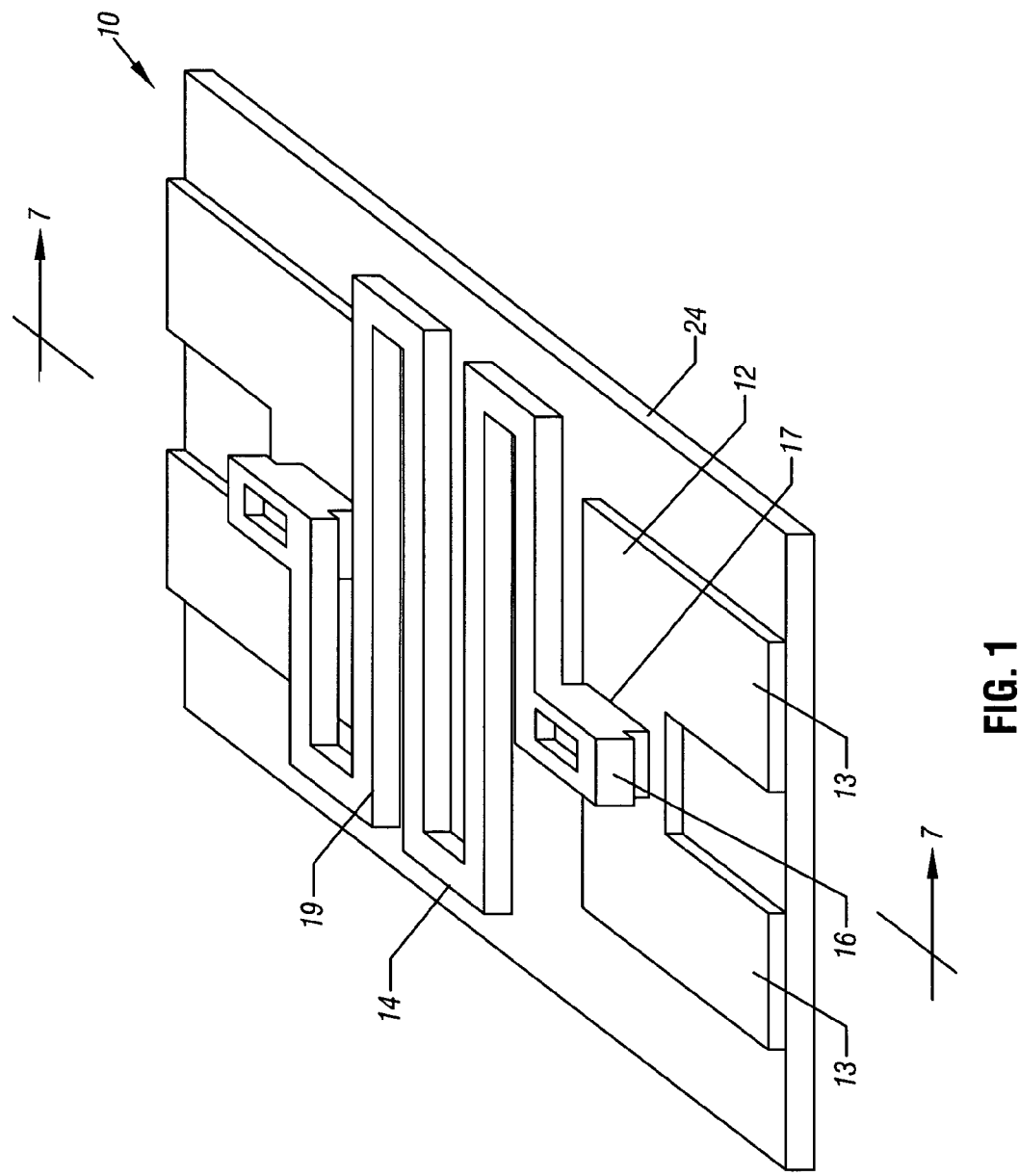
FIG. 1 is a perspective view of one embodiment of the present invention.

Referring to FIG. 1, a microfabricated hot wire vacuum sensor 10 may be formed using integrated circuit fabrication techniques on a substrate (not shown). In some embodiments, the sensor 10 may measure internal cavity pressure. In one embodiment, the sensor 10 may measure pressures in the range of $10^{-2}$ to $10^3$ Torr in vacuum packaged microsystems. The sensor 10 may also be used for leak testing of sealed integrated circuit or microsystem packages. Pressure monitoring in a vacuum packaged device may be performed directly by using the calibrated vacuum sensor 10. Leak tightness testing may be performed by an appropriate metrology that makes use of the vacuum sensor 10.

The sensor 10 may be formed on an insulator 24. A first U-shaped contact 12 is positioned on one side of the sensor 10 and a second U-shaped contact 12 is positioned on the opposite side. A contact foot 17 supports a serpentine, electrically conductive, suspended microfabricated wire 14. The foot 17 also electrically couples the contacts 12 and the wire 14. The wire 14 heats up when an electrical current, supplied through the contacts 12, is passed through the wire 14. In one embodiment, the contacts 12 may include two leads 13 to enable four-point resistance measurements.

The wire 14 heats up to a temperature determined, in part, by the applied voltage and the ambient pressure. The voltage across and the current through the wire 14 can be measured and, with proper calibration, the temperature of the wire 14 can also be measured. The voltage and current through the wire 14 allows the steady state heat loss from the wire 14 to be determined.

To measure the temperature of the suspended wire 14, the resistance of the wire 14 may be measured locally using a four-point resistance measurement and the temperature may be calculated using a known temperature coefficient of resistance or an appropriate calibration function for the wire material.

The wire itself acts as a thermistor or resistance-based temperature sensor. This arrangement may enable a simpler sensor with only one structural material that is amenable to integrated circuits, microfabrication, and integration with integrated circuits or microsystems.

Figure 2:
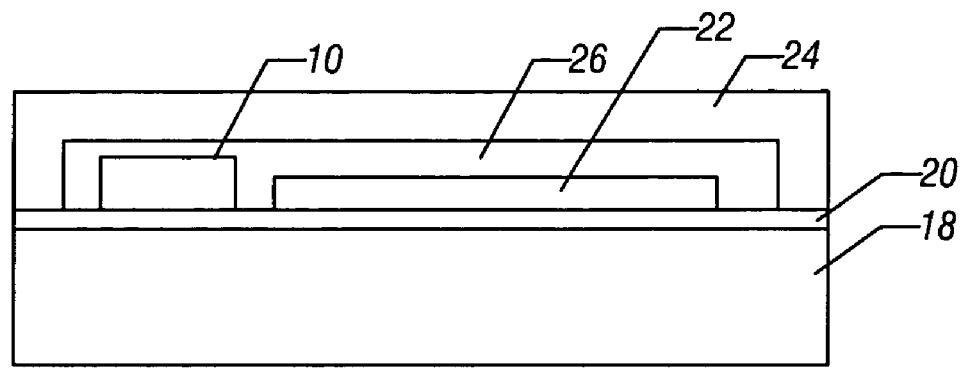
FIG. 2 is a reduced, cross-sectional view of one embodiment of the present invention.

Referring to FIG. 2, the sensor 10 may be formed over an insulator 20 on an integrated circuit 18. The device 10 may be fabricated using integrated circuit, monolithic fabrication techniques in one embodiment. At the same time, a microsystem 22 may also be formed over the substrate 18 using monolithic, microcircuit integrated circuit fabrication techniques.

The system 22 and the sensor 10 may then be hermetically sealed inside an enclosure 24. As a result, a hermetically sealed cavity 26 is established in isolation from the ambient atmosphere. In one embodiment, the cavity 26 may have a volume of less than a cubic centimeter.

The enclosure 24 may, for example, take the form of a lid bonded to the substrate 18, a dedicated physical housing for the sensor 10 and substrate 18, such as a metal or ceramic hermetic package, or a sealed chamber, such as a vacuum chamber.

In many cases, the vacuum sensor 10 may be integrated with little or no modification to the fabrication process used to form the microsystem 22.

The sensor 10 may be utilized to monitor the pressure inside the cavity 26. The vacuum sensor 10 may occupy a relatively small fraction of the volume inside the cover 24 and a relatively small fraction of the surface of the substrate or die 18 in one embodiment. For example, in one embodiment, the sensor 10 may be integrated with a system 22 including gold-cantilevered radio frequency switch, with no modification to the microfabrication process. The wire 14 may be formed of gold in such an embodiment.

Figure 3:
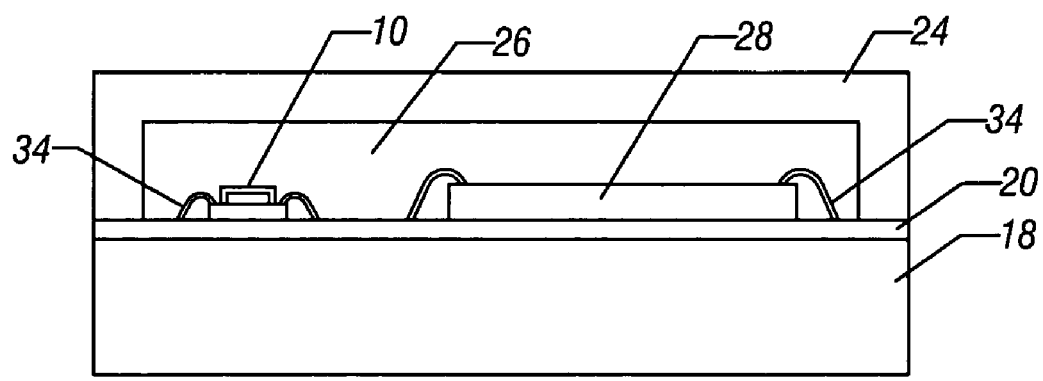
FIG. 3 is a reduced, cross-sectional view of another embodiment of the present invention.

Referring to FIG. 3, in accordance with another embodiment of the present invention, a hybrid integration scheme uses a vacuum sensor 10 within a sealed package. The vacuum sensor 10 may be formed as a separately fabricated integrated circuit die. A microsystem 28 may also be formed as a separate integrated circuit die. The dice for the sensor 10 and the circuit 28 may be packaged within a common enclosure 24. In some embodiments, the substrate 18 may be silicon, glass, ceramic, or an organic die or packaging substrate.

Wire bonding, flip-chip, and/or other electrical interconnect technologies may be utilized to couple the sensor 10 and the circuit 28 to one another and/or to other components. Hybrid integration may yield larger packages than those with the monolithic approach shown in FIG. 2. However, the use of the vacuum sensor 10 may offer advantages relative to existing vacuum sensor technology in terms of size, and likely in terms of cost, due to the small die size and simplicity of fabrication process.

Figure 4:
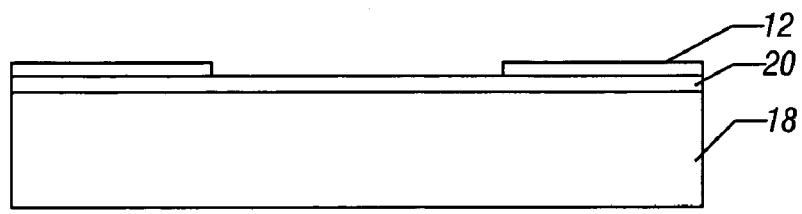
FIG. 4 is a reduced, cross-sectional view of one embodiment of the present invention in the course of manufacture.

Referring to FIG. 4, the fabrication of the sensor 10 may begin with the deposition of the insulator 20 on a substrate 18. A seed layer 12 may be deposited and patterned to form the contacts 12 on the opposed ends of the sensor 10.

Figure 5:
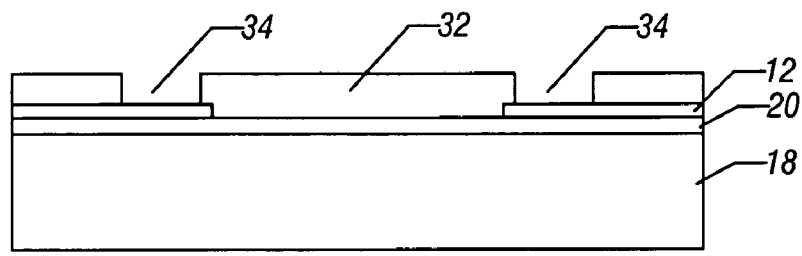
FIG. 5 is a reduced, cross-sectional view at a subsequent stage in accordance with one embodiment of the present invention.
Figure 6:
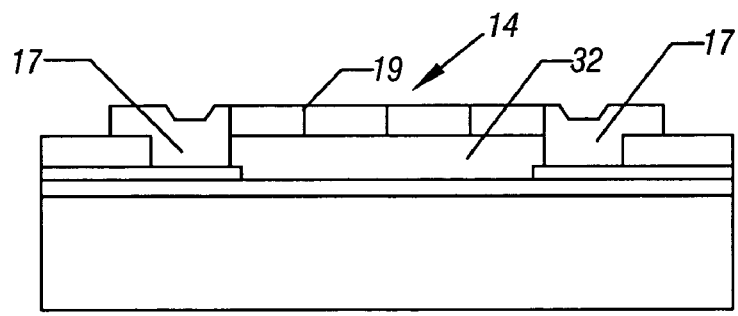
FIG. 6 is a reduced, cross-sectional view at a subsequent stage of manufacture in accordance with one embodiment of the present invention.

As shown in FIG. 5, a sacrificial layer 32 may be deposited and patterned to form the openings 34 in which the feet 17 will eventually be formed. Then, referring to FIG. 6, the wire 14 may be deposited and patterned over the sacrificial layer 32. The patterning may be done using conventional lithography and masking techniques.

Figure 7:
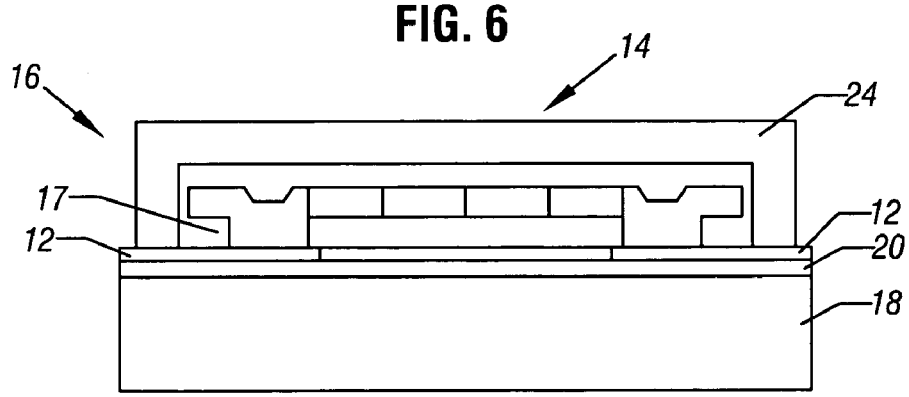
FIG. 7 is a reduced, cross-sectional view taken generally along the line 7—7 in FIG. 1 in accordance with one embodiment of the present invention over a substrate.

Then the layer 32 may be removed, for example, by chemical etching, heating, or using other release techniques. As a result, the wire 14 becomes suspended, as shown in FIG. 7, over the insulating layer 20, mounted on the feet 17.

The enclosure 24 may take the form of a lid attached to a substrate, a dedicated physical housing for the sensor and substrate, such as a metal and ceramic hermetic package, or a sealed chamber such as a vacuum chamber. The contacts 12 on the substrate 18 may extend under the enclosure 24 to enable electrical access to the vacuum sensor 10 from outside the enclosure 24. Electrical contacts may also pass to the exterior of the enclosure 24 through the enclosure 24 or through the substrate 18 (e.g., through conductive vias).

External measurement hardware (not shown) may be used to operate the sensor 10. Such hardware may include a DC power supply, an ammeter, and a voltmeter.

The system 22 may be a micromechanical transducer, a micro-electromechanical system, a micro optical transducer, a micro optical electromechanical system, a micro ionizing radiation transducer, a micro thermal transducer, a micro magnetic or electromagnetic transducer, a micro chemical or a biological transducer, or a microfluidic device, to mention a few examples. The system 22 may be sealed within the same enclosure 24 as the vacuum sensor 10.

The enclosure 24 may be part of the integrated circuit packaging or may itself be enclosed within other packaging, as two examples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   microfabricating a vacuum sensor;
   enclosing said vacuum sensor with an integrated circuit inside an enclosure, said sensor including a serpentine wire; and
   suspending said sensor on an upwardly extending contact.

2. The method of claim 1 including integrating said vacuum sensor and said integrated circuit in the same substrate.

3. The method of claim 1 including integrating said vacuum sensor and said integrated circuit on separate dice and enclosing said separate dice in the same enclosure.

4. The method of claim 1 including microfabricating the sensor as a suspended, serpentine wire.

5. The method of claim 1 including forming a contact on a surface, said contact coupled to said wire.

6. The method of claim 5 including making said contact U-shaped.

7. The method of claim 1 including providing an enclosure that covers said vacuum sensor and said integrated circuit and provides a hermetically sealed chamber.

8. The method of claim 7 including providing an electrical connection under said enclosure to the exterior of said chamber.

9. An integrated circuit device comprising:
   a microfabricated vacuum sensor including a serpentine wire, and a contact coupled to said wire, said contact including a vertical portion extending upwardly to said wire;
   an integrated circuit;
   an enclosure; and
   a substrate, said enclosure mounted on said substrate and enclosing both said vacuum sensor and said circuit within said enclosure.

10. The device of claim 9 wherein said vacuum sensor and said integrated circuit are monolithically integrated in the same die.

11. The device of claim 9 wherein said vacuum sensor and integrated circuit are on separate dice.

12. The device of claim 9 wherein said wire is suspended.

13. The device of claim 9 wherein said contact is U-shaped.

14. The device of claim 9 wherein said enclosure is hermetically sealed.

15. The device of claim 14 including an electrical connection extending under said enclosure to the exterior of said enclosure.

16. An integrated circuit device comprising:
   a substrate;
   a vacuum sensor integrated in said substrate including a serpentine wire, and a contact coupled to said contact including a vertical portion extending upwardly to said wire;
   an integrated circuit integrated in said substrate; and
   an enclosure, said enclosure mounted on said substrate and enclosing both said vacuum sensor and said integrated circuit within said enclosure.

17. The device of claim 16 wherein said wire is suspended.

18. The device of claim 16 wherein said contact is U-shaped.

19. The device of claim 16 wherein said enclosure is hermetically sealed.

20. The device of claim 19 including an electrical connection extending under said enclosure to the exterior of said enclosure.

* * * * *

UNITED STATES PATENT AND TRADEMARK OFFICE
CERTIFICATE OF CORRECTION

PATENT NO. : 7,087,451 B2  Page 1 of 1
APPLICATION NO. : 10/807836
DATED : August 8, 2006
INVENTOR(S) : Leonel R. Arana et al.

It is certified that error appears in the above-identified patent and that said Letters Patent is hereby corrected as shown below:

Column 4:
Line 44, after "couple to said", insert --wire, said--.

Signed and Sealed this

Fourteenth Day of November, 2006

JON W. DUDAS
*Director of the United States Patent and Trademark Office*